United States Patent [19]

Sharpe-Geisler

[11] Patent Number: 5,736,888
[45] Date of Patent: Apr. 7, 1998

[54] CAPACITANCE ELIMINATION CIRCUIT WHICH PROVIDES CURRENT TO A NODE IN A CIRCUIT TO ELIMINATE THE EFFECT OF PARASITIC CAPACITANCE AT THE NODE

[75] Inventor: Bradley A. Sharpe-Geisler, San Jose, Calif.

[73] Assignee: Advanced Micro Devices, Inc.

[21] Appl. No.: 575,898

[22] Filed: Dec. 20, 1995

[51] Int. Cl.$^6$ .................................................. H03K 17/16
[52] U.S. Cl. ........................ 327/382; 327/170; 327/380; 327/391; 326/27
[58] Field of Search ........................ 327/379, 382, 327/434, 545, 546, 390, 391, 380, 381, 387, 170, 538, 540, 541, 543; 326/21, 31, 34, 44, 45; 365/222

[56] References Cited

U.S. PATENT DOCUMENTS

| | | |
|---|---|---|
| 4,484,147 | 11/1984 | Metz ........................................ 330/291 |
| 5,218,523 | 6/1993 | Sugishima ................................ 327/390 |
| 5,365,118 | 11/1994 | Wilcox ..................................... 327/390 |

Primary Examiner—Timothy P. Callahan
Assistant Examiner—Kenneth B. Wells
Attorney, Agent, or Firm—Fliesler, Dubb, Meyer & Lovejoy, LLP.

[57] ABSTRACT

A capacitance elimination circuit for eliminating known parasitic capacitance at a node in a circuit. The capacitance elimination circuit is particularly useful at a connection of multiple pass gates in a switch matrix of a programmable logic device (PLD). The capacitance elimination circuit includes a current measuring device including a measuring capacitor having a first end connected to the node having the known capacitance. A second end of the measuring capacitor is connected to a current supply mechanism which provides current to the node to replace current withdrawn by the parasitic capacitance. In one embodiment, the current supply mechanism includes a first current mirror made up of transistors having a first channel type, the first current mirror having one arm coupled to the second end of the measuring capacitor. Another arm of the first current mirror is connected to an arm of a second current mirror made up transistors having a second channel type. Another arm of the second current mirror is then connected to the node to replace current withdrawn by its parasitic capacitance. Current gain provided by the first and second current mirrors is controlled to be substantially equal to current loss due to the parasitic capacitance and the measuring capacitor.

23 Claims, 10 Drawing Sheets

CAPACITANCE ELIMINATION CIRCUIT WHICH PROVIDES CURRENT TO A NODE IN A CIRCUIT TO ELIMINATE THE EFFECT OF PARASITIC CAPACITANCE AT THE NODE

BACKGROUND OF THE INVENTION

1. Field of the Invention

The present invention relates to circuitry utilized to eliminate the effect of capacitance. More particularly, the present invention relates to circuitry utilized to eliminate the effect of capacitance in the switch matrix of a programmable logic device (PLD).

2. Description of the Related Art

FIG. 1 shows components in an input portion of a switch matrix for a high density PLD. In the input portion shown, a signal input to the switch matrix is received at one of 64 input points such as 101 and 102. From point 101, 32 pass gates are controlled to selectively connect the point 101 to one of 32 lines. Similarly, pass gates are provided from the other 64 input points, such as point 102 to the 32 lines through pass gates.

FIG. 2 is a block diagram illustrating components of a switch matrix with connections to programmable array logic (PAL) blocks in a PLD. In FIG. 2, several input portions for a switch matrix, as shown in FIG. 1, such as 202, provide 32 outputs to multiplexers, such as 204, the multiplexers also being included in the switch matrix. The multiplexers connect the 32 outputs from the input portions of the switch matrix, either together, or individually to 128 lines. The 128 multiplexer lines are connected to 128 input buffers (not shown) of a PAL block, such as 206.

The PAL blocks, such as 206, can be viewed as independent PLD devices on the chip, each similar to the popular lower density 22V10 PAL device, available from Advanced Micro Devices, Inc. The switch matrix, including input portions, such as 202, and multiplexers, such as 204, functions to connect the PAL blocks to each other and to all input pins and output pins on a single integrated circuit to form a high density PLD.

FIG. 3 illustrates how pass gates forming more than one of the 32 output lines of the input portion of a switch matrix are connected together by a multiplexer in the switch matrix to form an input to a PAL block. In FIG. 3, three of 32 output lines 301–303 are shown connected together. As illustrated, the multiplexer simply connects each of the three lines 301–303 together and to the input of an input buffer 306.

FIG. 4 shows an equivalent circuit for the circuitry of FIG. 3. The plurality of pass gates connected together to form line 301 create a parasitic capacitance $C_1$, while line resistance on line 301 creates a resistance $R_1$. Similarly, parasitic capacitance and line resistance for lines 302 and 303 form parasitic capacitances $C_2$ and $C_3$ and resistances $R_2$ and $R_3$. Thus, an RC delay $R_1C_1$, $R_2C_2$, and $R_3C_3$ is added by each one of lines 301–303. With a signal provided at the switch matrix input and directed through line 301 to buffer 306, significant distortion as well as delay will be caused by each of the RC delays, $R_1C_1$, $R_2C_2$, and $R_3C_3$.

One proposed solution to reduce the effect of the RC delays in a switch matrix is illustrated in FIG. 5. In FIG. 5, deconvolution buffers are used for buffers 502, 504 and 306 to compensate for the RC delay of each switch matrix line. A deconvolution buffer is disclosed in a pending U.S. patent application Ser. No. 08/341,636. A deconvolution buffer utilizes a variable threshold which is set to compensate for distortion caused by a known RC delay.

Utilization of deconvolution buffers to compensate for RC delay, however, still has undesirable effects. First, only distortion in the input signal caused by an RC component is compensated for, and not overall delay time. Further, the deconvolution buffer only works for signals provided in one direction. To enhance the configurability of a switch matrix, it is desirable to have the ability to configure lines of the switch matrix to carry signals in both directions. In other words, it is desirable for a line to have an input and an output which are interchangable.

SUMMARY OF THE INVENTION

The present invention eliminates parasitic capacitance for any circuit at a point a parasitic capacitance value is known.

The present invention is particularly useful for a switch matrix in a PLD where parasitic capacitance of multiple pass gates occurs at multiple points throughout the switch matrix. The present invention serves to eliminate parasitic capacitance at a connection of multiple pass gates in a switch matrix of a PLD to eliminate both distortion and overall delay time due to RC delay. The present invention further functions at a point in a switch matrix where signals can be provided in more than one direction.

The present invention is a capacitance elimination circuit which functions to add current to a node in a circuit to match current withdrawn by parasitic capacitance at the node to effectively eliminate the parasitic capacitance. The capacitance elimination circuit of the present invention includes a current measuring means connected to a node in a circuit having a known parasitic capacitance, and a current supply means. The current measuring means receives current provided to the node and provides an indication of a portion of the current withdrawn from the node by the parasitic capacitance. The current supply means then provides current to the node substantially equal to the current withdrawn by the parasitic capacitance as determined from the indication of current withdrawn from the current measuring device.

In one embodiment, the current measurement means includes a measuring capacitor having a first end connected to the node having the known capacitance. In the embodiment, the current supply means includes a PMOS cascode having a source connected to a second end of the measuring capacitor, the PMOS cascode further having a drain connected to one arm of a first current mirror made up of NMOS transistors. Another arm of the first current mirror is connected to an arm of a second current mirror made up of PMOS transistors. Another arm of the second current mirror is then connected to the node to replace current withdrawn by its parasitic capacitance when current provided to the node is transitioning the node from low to high. The current supply means further includes an NMOS cascode having a source connected to a second end of the measuring capacitor, the NMOS cascode further having a drain connected to one arm of a third current mirror made up of PMOS transistors. Another arm of the third current mirror is connected to an arm of a fourth current mirror made up of NMOS transistors. Another arm of the fourth current mirror is then connected to the node to replace current withdrawn by its parasitic capacitance when current provided to the node is transitioning the node from high to low.

In the current measuring mechanism, gain of the first, second, third and fourth current mirrors is controlled so that current withdrawn by the parasitic capacitance and the measuring capacitor is equal to the current replaced by the capacitance elimination circuit. The capacitance of the measuring capacitor is made substantially less than the parasitic capacitance of the node to prevent oscillations.

BRIEF DESCRIPTION OF THE DRAWINGS

Further details of the present invention are explained with the help of the attached drawings in which.

DETAILED DESCRIPTION

Figure 1:
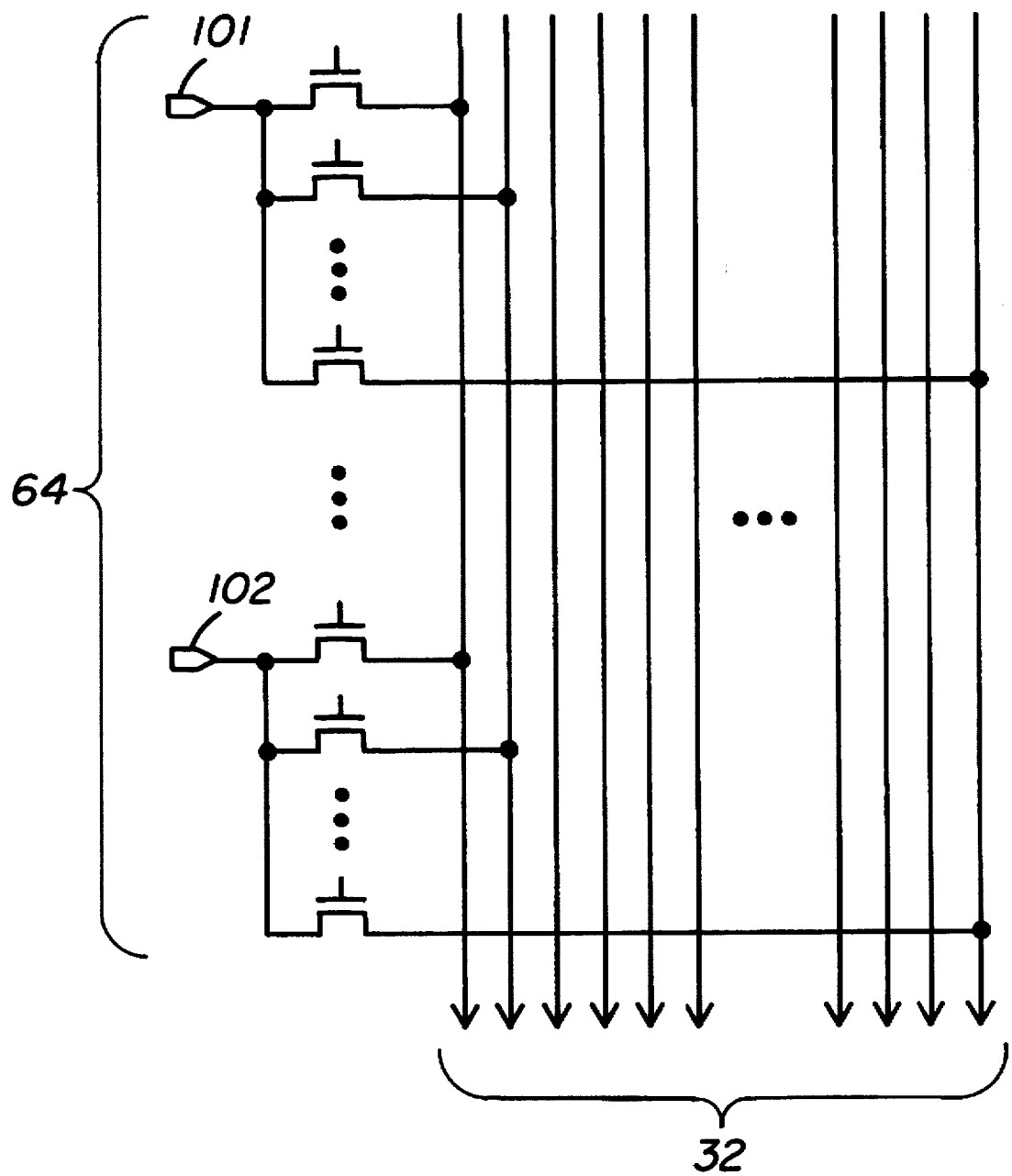
FIG. 1 shows components in an input portion of a switch matrix for a high density PLD.
Figure 2:
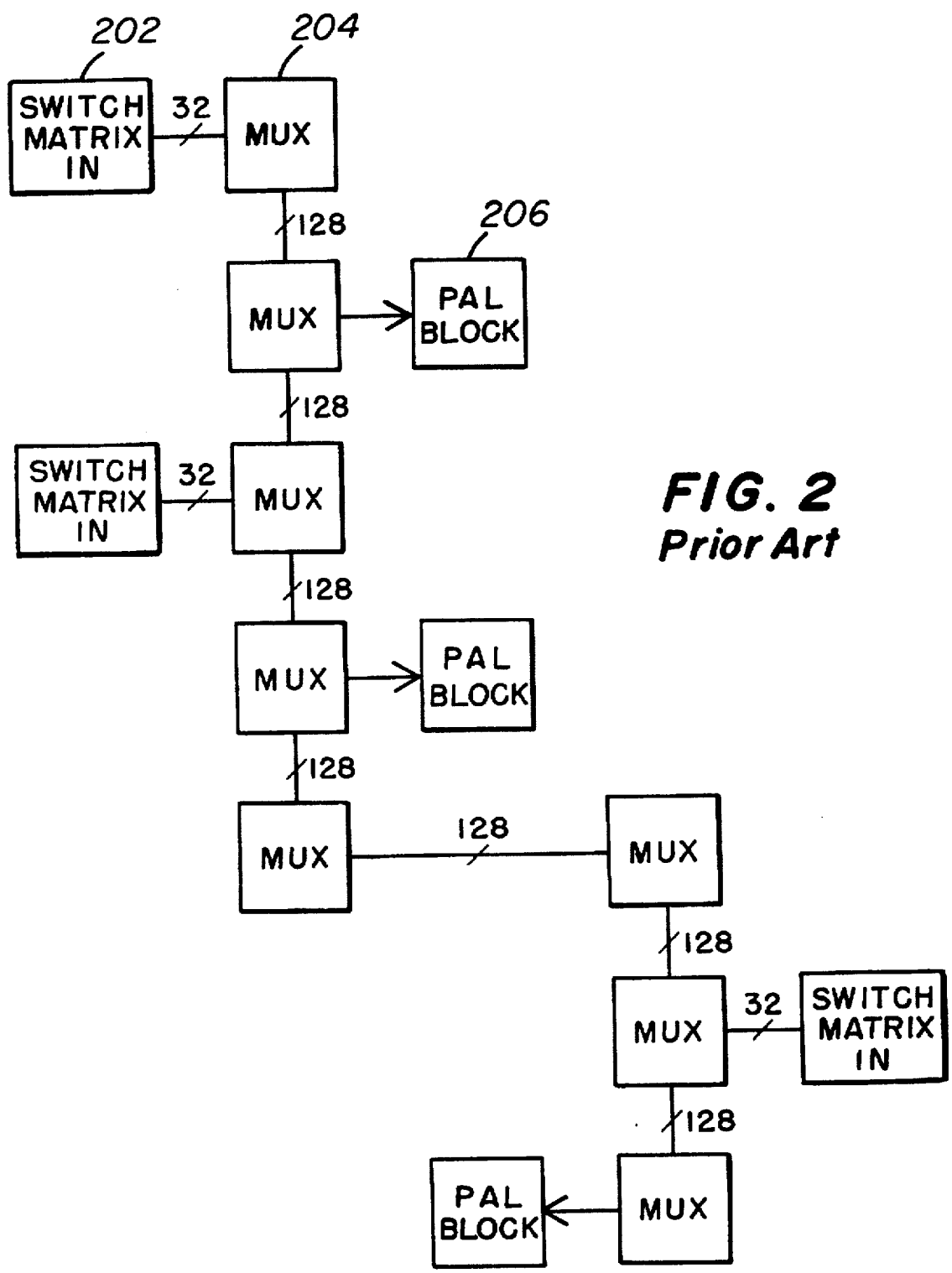
FIG. 2 is a block diagram illustrating components of a switch matrix with connections to PAL blocks in a PLD.
Figure 3:
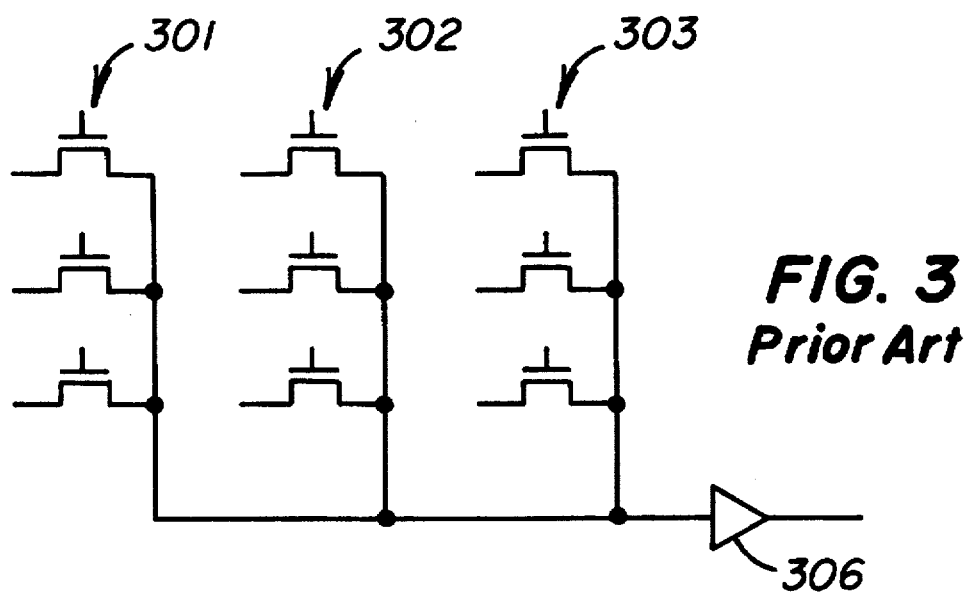
FIG. 3 illustrates how pass gates forming more than one of the 32 output lines of the input portion of a switch matrix are connected together by a multiplexer in the switch matrix to form an input to a PAL block.
Figure 4:
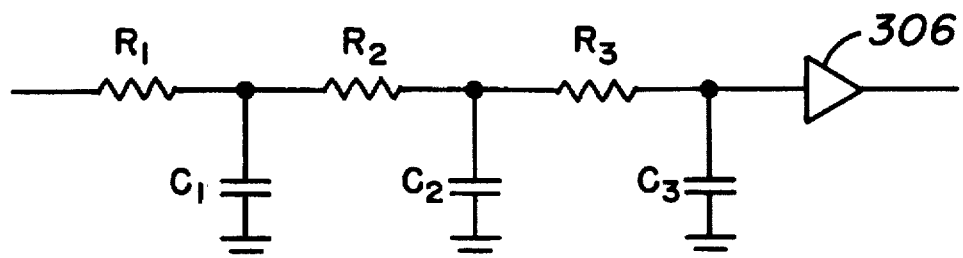
FIG. 4 shows an equivalent circuit for the circuitry of FIG. 3.
Figure 5:
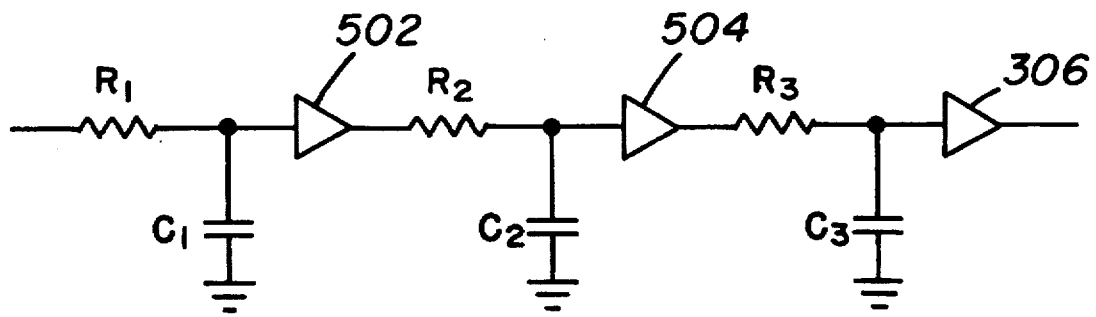
FIG. 5 illustrates a solution to reduce the effect of RC delays in a switch matrix.
Figure 6:
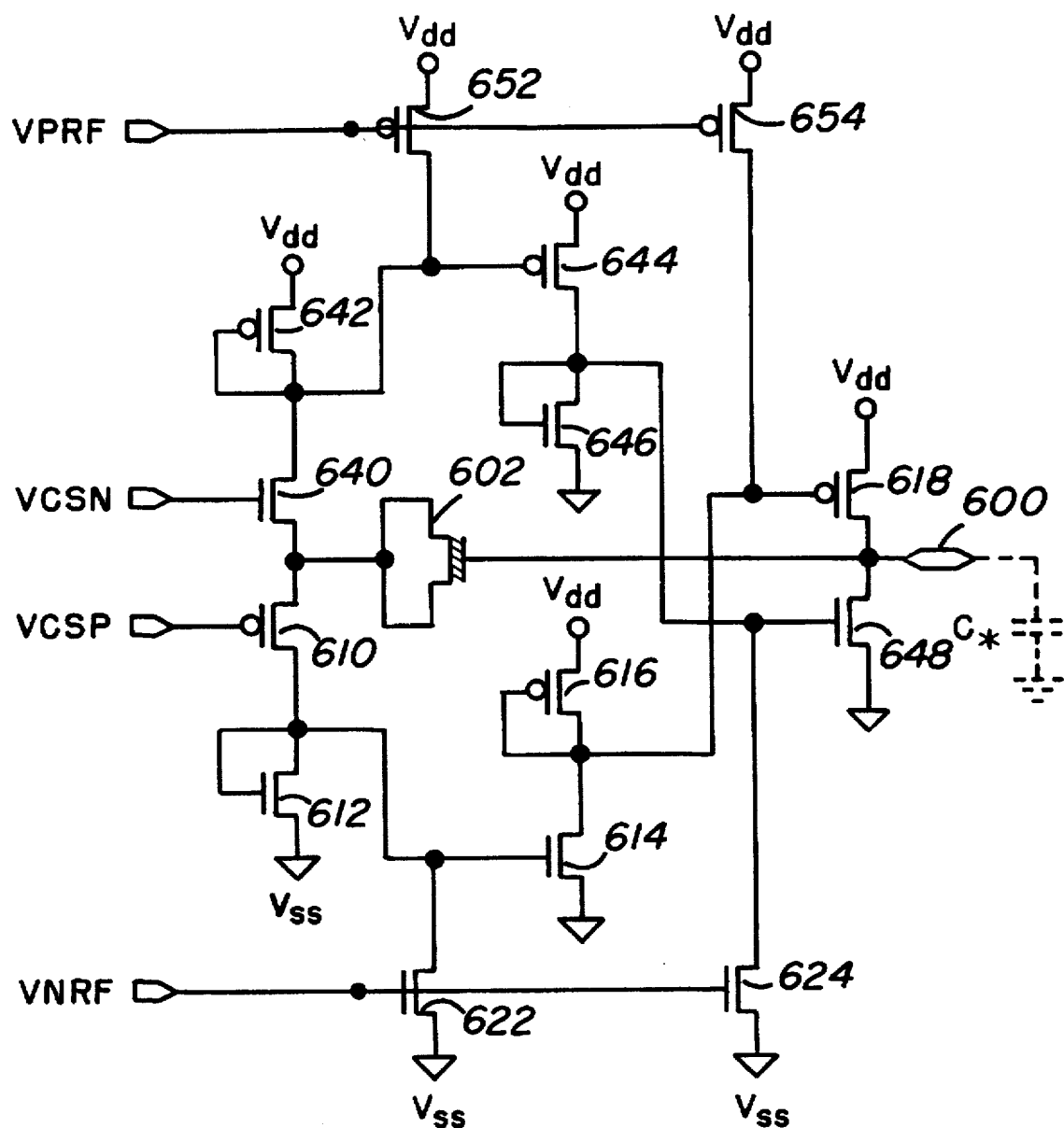
FIG. 6 shows an embodiment of the capacitance elimination circuit of the present invention.

FIG. 6 shows an embodiment of the capacitance elimination circuit of the present invention. The capacitance elimination circuit of FIG. 6 has a node 600 which is connected to a node in a circuit where a known parasitic capacitance exists. In FIG. 6, the parasitic capacitance is represented by a value C* shown in dashed lines.

The circuit of FIG. 6 further includes a capacitor 602 having one terminal connected to node 600. Capacitor 602 serves to measure current provided to node 600 since the voltage on the second end of capacitor 602 will be proportional to the current received at node 600. Capacitor 602 is preferably made substantially smaller than C* to only subtract a minimal amount of current to not affect the node 600. The remainder of the circuitry of FIG. 6 provides a current supply means which provides current to node 600 substantially equal to current withdrawn by the parasitic capacitance C* as determined from the voltage indication at the second terminal of the capacitor 602.

The current supply means can be formed by four current mirrors, as shown in FIG. 6. A first and second current mirror are connected to function so that when current provided to node 600 is increasing in a positive direction to transition node 600 from low to high, the current supply means will provide an increasing positive current to node 600 to replace current withdrawn by capacitor C*, the current withdrawn by C* tending to transition node 600 from high to low. A third and fourth current mirror are connected to function so that when current provided to node 600 is increasing in a negative direction to transition node 600 from high to low, the current supply means will increase current in a negative direction to replace current withdrawn by capacitor C*, the current withdrawn by C* tending to transition node 600 from low to high.

The first current mirror is formed by NMOS transistors 612 and 614 having gates connected together and sources connected to Vss. A first arm of the first current mirror is formed by the gate to drain connection of transistor 612 which is coupled to the second end of capacitor 602. The second current mirror is formed by PMOS transistors 616 and 618 having gates connected together and sources connected to Vdd. A first arm of the second current mirror is formed by the gate to drain connection of transistor 616 which is coupled to a second arm of the first current mirror formed by the drain of transistor 614. A second arm of the second current mirror is formed by the drain of transistor 618 which is connected to node 600. In FIG. 6, as well as subsequent drawings, PMOS transistors, such as 618, are shown with a circle on their gate, while NMOS transistors, such as 648, are shown without such a circle.

The third current mirror is formed by PMOS transistors 642 and 644 having gates connected together and sources connected to Vdd. A first arm of the third current mirror is formed by the gate to drain connection of transistor 642 which is coupled to the second end of capacitor 602. The fourth current mirror is formed by NMOS transistors 646 and 648 having gates connected together and sources connected to Vss. A first arm of the fourth current mirror is formed by the gate to drain connection of transistor 646 which is coupled to a second arm of the third current mirror formed by the drain of transistor 644. A second arm of the fourth current mirror is formed by the drain of transistor 648 which is connected to node 600.

In operation, we first assume that current provided to node 600 is increasing in a positive direction to transition node 600 from low to high. With current provided to node 600 increasing to transition node 600 from low to high, the voltage at the second terminal of capacitor 602 will increase. The increasing voltage at the second terminal of capacitor 602 will increase current provided through transistor 612 in the first current mirror, while decreasing current provided through transistor 642 in the third current mirror.

With increasing current in transistor 612 of the first current mirror, transistor 614 will mirror such current causing an increase in current through transistor 616 of the second current mirror. The increasing current in transistor 616 of the second current mirror will then be mirrored by transistor 618 to increase current provided to node 600 to transition node 600 from low to high to compensate for current withdrawn by capacitor C*.

With decreasing current in transistor 642 of the third current mirror, transistor 644 will mirror such current causing a decrease in current through transistor 646 of the fourth current mirror. The decrease in current in transistor 646 of the fourth current mirror will then be mirrored by transistor 648 to prevent transistor 648 from counteracting transistor 618.

We next assume that current provided to node 600 is increasing in a negative direction to transition node 600 from high to low. With current provided to node 600 transitioning node 600 from high to low, the voltage at the second terminal of capacitor 602 will decrease. The decreasing voltage at the second terminal of capacitor 602 will decrease current provided through transistor 612 in the first current mirror, while increasing current provided through transistor 642 in the third current mirror.

With increasing current in transistor 642 of the third current mirror, transistor 644 will mirror such current causing an increase in current through transistor 646 of the fourth current mirror. The increase in current in transistor 646 of the fourth current mirror will then be mirrored by transistor 648 to increase current provided to node 600 to transition node 600 from high to low to compensate for current withdrawn by capacitor C*.

With decreasing current in transistor 612 of the first current mirror, transistor 614 will mirror such current causing a decrease in current through transistor 616 of the second current mirror. The decreasing current in transistor 616 of the second current mirror will then be mirrored by transistor 618 to prevent transistor 618 from counteracting transistor 648.

To prevent oscillation at node 600, the current provided by transistors 618 or transistors 648 should be slightly less than current withdrawn by capacitors C* and 602. The value of C* should, therefore, be known and the sizes of transistors forming current mirrors be selected to control gain accordingly. Gain is controlled by the ratio of the size of transistors in the current mirror. For instance, in the first mirror the size of transistor 614 is made larger than transistor 612 to increase gain of a signal provided to the second current mirror.

As an example of setting gain in the current mirrors to assure the capacitance C* is compensated for, we first assume that the total current withdrawn by the capacitor C* and capacitor 602 from node 600 is ⅙ the total current which will be provided through either transistor 612 or 642. The size of transistors in the first and second current mirrors may then be set so that the gain of the first current mirror will be two times the current received, and the gain of the second current mirror will be three times the current received so that the total current supplied to node 600 by transistor 618 will be six times the current through transistor 612. The size of transistors in the third and fourth current mirrors will then likewise be set so that the gain of the third current mirror will be two times the current received, and the gain of the fourth current mirror will be three times the current received so that the total current supplied to node 600 by transistor 648 will be six times the current through transistor 612. With the current withdrawn from node 600 by capacitors C* and 602 being ⅙ of the current through either transistor 642 or 612, and the current supplied by transistor 618 or 648 being 6 times the current through transistor 612 or 642, the effect of the parasitic capacitance C* will be eliminated.

Cascode transistors 618 and 648 may be provided to limit lag from when capacitor C* withdraws current from node 600 to when transistor 618 or transistor 648 replaces the current withdrawn by C*. Cascode transistors 610 and 640 limit lag by providing significant gain from their source to drain. Cascode transistor 610 is a PMOS device having a source connected to the second terminal of capacitor 602, a drain connected to the drain of transistor 612, and a gate connected to a reference VCSP. Likewise, cascode transistor 640 has a source connected to the second terminal of capacitor 602, a drain connected to the drain of transistor 642, and a gate connected to a reference VCSN.

In addition to providing significant gain, a cascode transistor is defined by being turned on and off by varying the voltage applied to its source with the gate voltage fixed, rather than varying its gate voltage. In a cascode transistor with $(v_g-v_s)>v_t$, wherein $v_g$ is the gate voltage, $v_s$ is the source voltage, and $v_t$ is the threshold voltage of the transistor, the cascode transistor will turn on. With $(v_g-v_s)<v_t$, the cascode transistor will turn off. As configured, PMOS cascode transistor 640 serves to turn off to correspond with decreasing current in the first and second current mirrors, and NMOS cascode 640 serves to turn off to correspond with decreasing current in the third and fourth current mirrors.

Transistors 622 and 652 are utilized to reduce power consumption when no change occurs in voltage at node 600 to keep cascodes 610 and 640 in bias. Transistor 622 is an NMOS device connected as a current sink to the gates of transistors 612 and 614. Transistor 652 is a PMOS device connected as a current source to the gates of transistors 642 and 644.

With the voltages at VCSN and VCSP separated to bias cascodes 610 and 640 to operate as desired, cascode transistor 640 will constantly sink current from the drain of transistor 642, while cascode 610 will constantly source current to the drain of transistor 612. With transistor 642 sourcing current, the gate of transistor 644 will be lowered to turn on transistor 644 which will in response turn on 648. Further, with transistor 612 sinking current, the gate of transistor 614 will be raised to turn on transistor 614 which will in response turn on transistor 618. With transistors 618 and 648 constantly turned on, the circuit of FIG. 6 will constantly consume power and will not be desirable for use in a low power device.

Transistor 652 is, thus, provided to source current necessary to bias cascode 640 without requiring significant current be supplied by transistor 642. Similarly, transistor 622 is, thus, provided to sink current necessary to bias cascode 610 without requiring transistor 612 to sink significant current. With transistor 652 sourcing all current required to bias cascode 640, and with transistor 622 sinking all current required to bias cascode 610, transistors 618 and 648 may be turned completely off to prevent any significant power consumption by the circuit of FIG. 6.

However, if transistors 652 and 622 source and sink sufficient current to turn off transistors 642 and 612, the circuit of FIG. 6 will not operate as fast when a transition occurs at node 600. To enable fast operation, transistors 624 and 654 are provided. Transistor 624 is an NMOS device connected as a current sink to the gates of transistors 646 and 648. Transistor 654 is a PMOS device connected as a current source to the gates of transistors 616 and 618.

In operation transistor 654 enables transistor 622 to sink current while enabling transistor 612 to not completely turn off to increase operation speed, while turning transistor 618 off to reduce power consumption. With transistor 612 not being completely turned off, transistor 614 will also not be turned off. However, transistor 654 can be configured to provide current to bias the gates of transistors 616 and 618 to compensate for transistor 614 sinking current to enable transistor 618 to turn completely off. Similarly, transistor 624 enables transistor 642 to source current to increase operation speed, while enabling transistor 648 to be completely turned off. With transistor 642 not being completely turned off, transistor 644 will also not be turned off. However, transistor 624 can be configured to sink current to bias the gates of transistors 646 and 648 to compensate for the current sourced by transistor 644 to enable transistor 648 to turn completely off.

Figure 7:
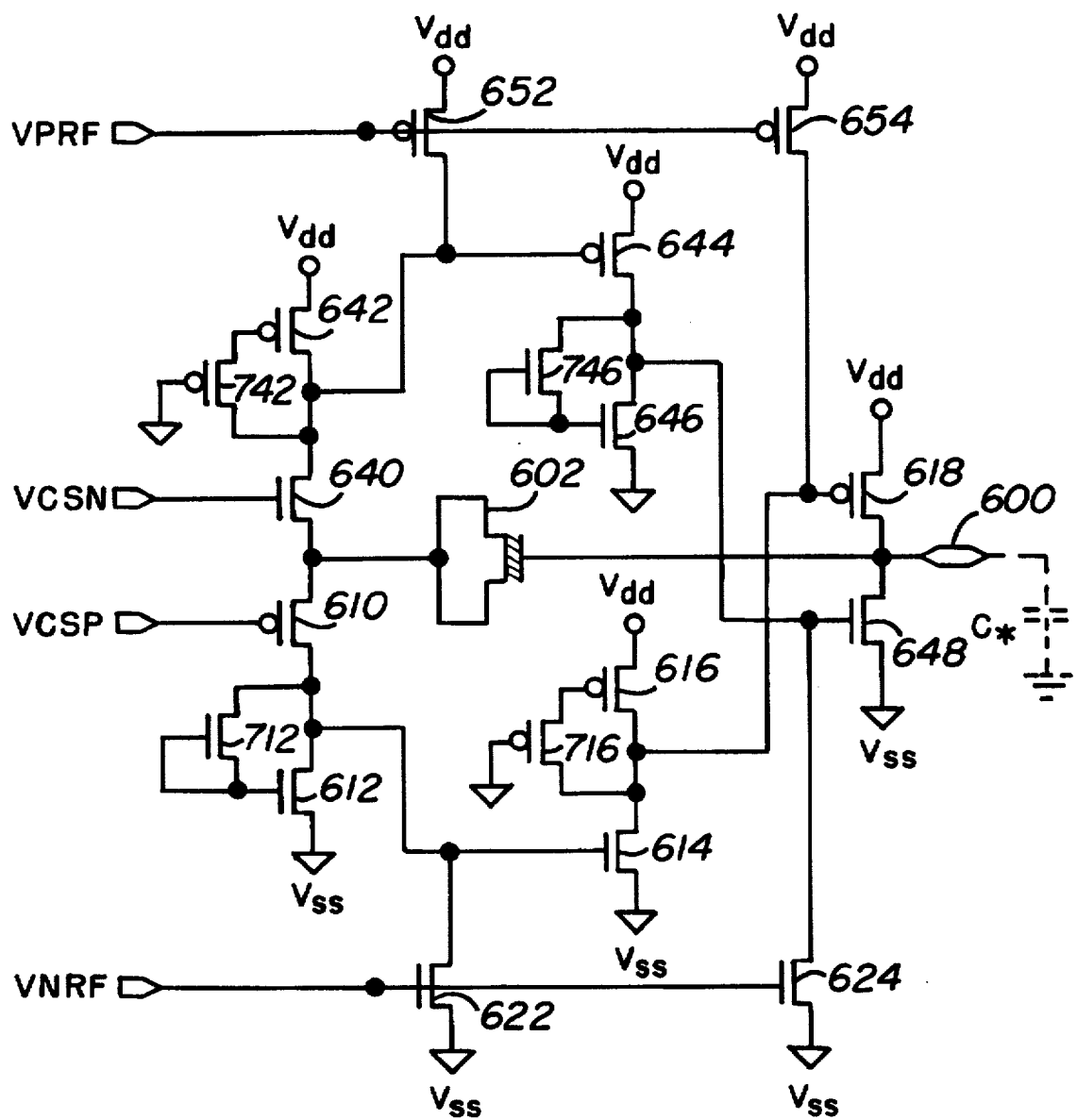
FIG. 7 shows modification to the circuit of FIG. 6 to minimize distortion in the current mirrors due to RC delay.

FIG. 7 shows modification to the circuit of FIG. 6 to minimize distortion in the current mirrors due to RC delay.

In FIG. 7, components carried forward from FIG. 6 are similarly labeled as are components in subsequent figures. In the circuit of FIG. 7, transistors 712, 716, 742 and 746 have been added. Transistor 712 is an NMOS transistor having a source to drain path coupling that drain of transistor 612 to its gate, as opposed to the direct gate to drain connection of transistor 612 in FIG. 6. The gate of transistor 712 is further connected to the gate of transistor 612. Similarly, transistor 746 is an NMOS transistor having a source to drain path coupling the drain of transistor 646 to its drain, and having a gate connected to the gate of transistor 646. Transistor 716 is a PMOS transistor having a source to drain path coupling the gate of transistor 616 to its drain, as opposed to the direct gate to drain connection of transistor 616 in FIG. 6. The gate of transistor 716 is connected to Vss. Similarly, transistor 742 is an NMOS transistor having a source to drain path coupling the gate of transistor 642 to its drain, and having a gate connected to Vss.

As connected transistor 712 provides a delay in a signal from the drain to gate of transistor 612. Similarly, transistors 716, 742 and 746 provide a delay in a signal from the drain to gate of respective transistors 616, 642 and 646.

Figure 8:
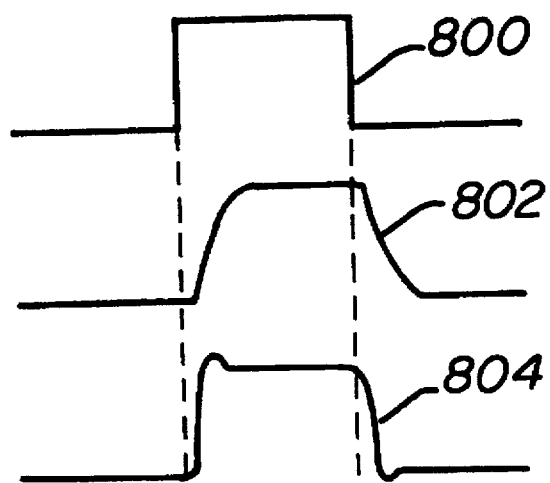
FIG. 8 shows signals illustrating how the modifications in FIG. 7 minimize distortion in the current mirrors.

FIG. 8 shows signals illustrating how the modifications to FIG. 6 in FIG. 7 minimize distortion in the current mirrors. In FIG. 8, a voltage signal 800 is shown which occurs at the second terminal of capacitor 602. A signal responsive to the signal 800 at the drain of transistor 612 with the gate of transistor 612 connected directly to its drain is shown as signal 802. A signal responsive to the signal 800 at the drain of transistor 612 with the gate of transistor 612 connected to its drain through transistor 712 is shown as signal 804. By comparing signal 802 to signal 804, it can be seen that utilizing transistor 712 prevents signal distortion due to RC delay from the drain to gate of transistor 612. Similar distortion is prevented by transistors 716, 742 and 746.

Figure 9:
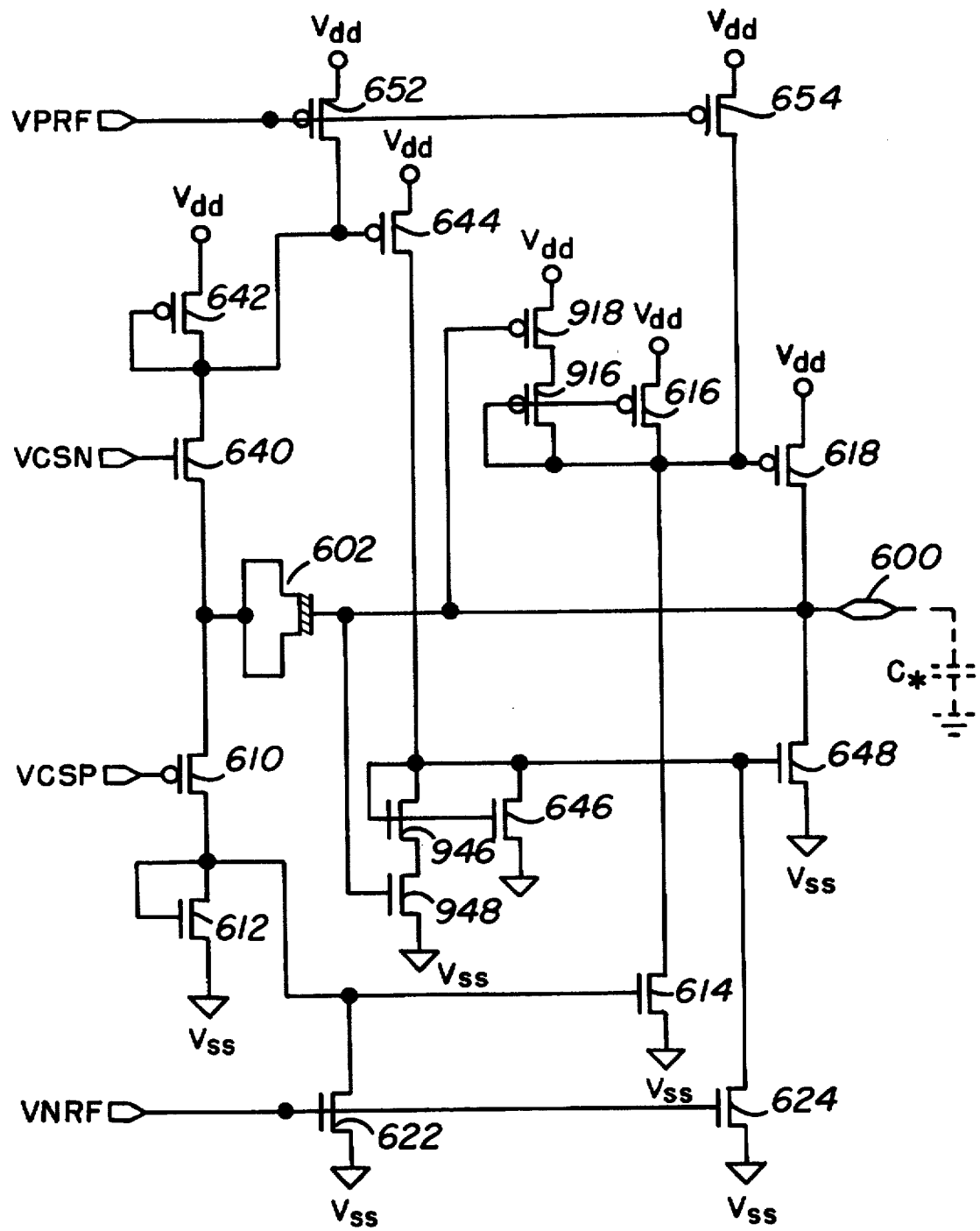
FIG. 9 shows modifications to the circuit of FIG. 6 to improve noise rejection and increase operation speed.

FIG. 9 shows modifications to the circuit of FIG. 6 to improve noise rejection and increase operation speed. In FIG. 9, PMOS transistor 916 is added in parallel with transistor 616, transistor 916 having a gate and drain connected together to the gate of transistor 618. PMOS transistor 918 has a source to drain path coupling Vdd to the source of transistor 916, and a gate connected to node 600. Further, an NMOS switching transistor 946 is added in parallel with transistor 646, transistor 946 having a gate and drain connected together to the gate of transistor 648. NMOS transistor 948 has a source to drain path coupling Vss to the source of transistor 946, and a gate connected to node 600.

In operation with the added circuitry of FIG. 9 we first assume that node 600 is transitioning from low to high. With node 600 low, transistor 918 will be on, and transistor 948 will be off. With a transition of node 600 from low to high, the first and second current mirrors will function to increase current in transistor 618, while the third and fourth current mirrors decrease current in transistor 648. To increase current in transistor 618, transistor 616 will provide a decreasing voltage at the gate of transistor 618. However, transistor 918 provided in parallel with transistor 616 will provide more current as controlled by transistor 918. Thus, at the beginning of the low to high transition at node 600, transistors 616 and 916 will act together to hold the gate of transistor 618 at a higher voltage than with transistor 616 acting alone so that transistor 618 provides less current to node 600. However, later, when the low to high transition at node 600 is nearly complete, transistor 616 will act without transistor 916 so that transistor 618 is turned on to a greater extent.

We next assume that node 600 is transitioning from high to low. With node 600 low, transistor 948 will be on, and transistor 918 will be off. With a transition of node 600 from high to low, the first and second current mirrors will function to decrease current in transistor 618, while the third and fourth current mirrors increase current in transistor 648. To increase current in transistor 648, transistor 646 will provide an increasing voltage at the gate of transistor 648. However, transistor 946 provided in parallel with transistor 646 will sink more current to ground as controlled by transistor 948. Thus, at the beginning of the high to low transition at node 600, transistors 646 and 946 will act together to hold the gate of transistor 648 at a lower voltage than with transistor 646 acting alone so that transistor 648 pulls less current from node 600 to Vss. However, later when the high to low transition at node 600 is nearly complete, transistor 646 will act without transistor 946 so that transistor 648 is turned on to a greater extent.

Figure 10:
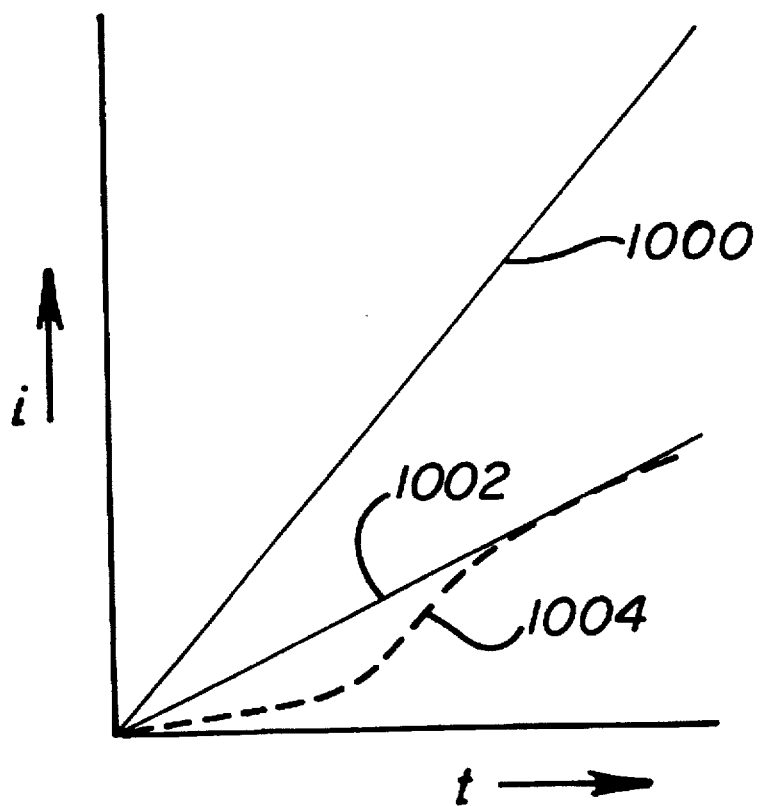
FIG. 10 illustrates the functional difference between the circuitry of FIG. 6 and FIG. 9 on a low to high transition.

FIG. 10 illustrates the functional difference between the circuitry of FIG. 6 and FIG. 9 on a low to high transition. In FIG. 10, a current signal 1000 is shown which is provided to node 600 to transition node 600 from low to high. In response to the signal 1000 at node 600, a responding current signal provided by transistor 618 with the circuitry of FIG. 6 is shown as signal 1002. In response to signal 1000, the responding current signal provided by transistor 618 with the circuitry of FIG. 9, where transistors 916 and 918 are added, is shown by signal 1004 in dashed lines. Although not shown, on a high to low transition at node 600, the functional difference between the outputs of transistor 648 is similar to the difference in outputs of transistor 618 on a low to high transition.

With the current provided by transistors 618 and 648 being decreased at a beginning of a transition of node 600, the capacitance elimination circuit of FIG. 9 will more closely provide current withdrawn by a typical parasitic capacitance, such as capacitor C*, than with the circuit of FIG. 6. Thus, with the circuit of FIG. 9, noise in other circuitry connected to node 600 will be decreased from that when FIG. 6 is connected to node 600, and operation speed will likewise be increased.

Figure 11:
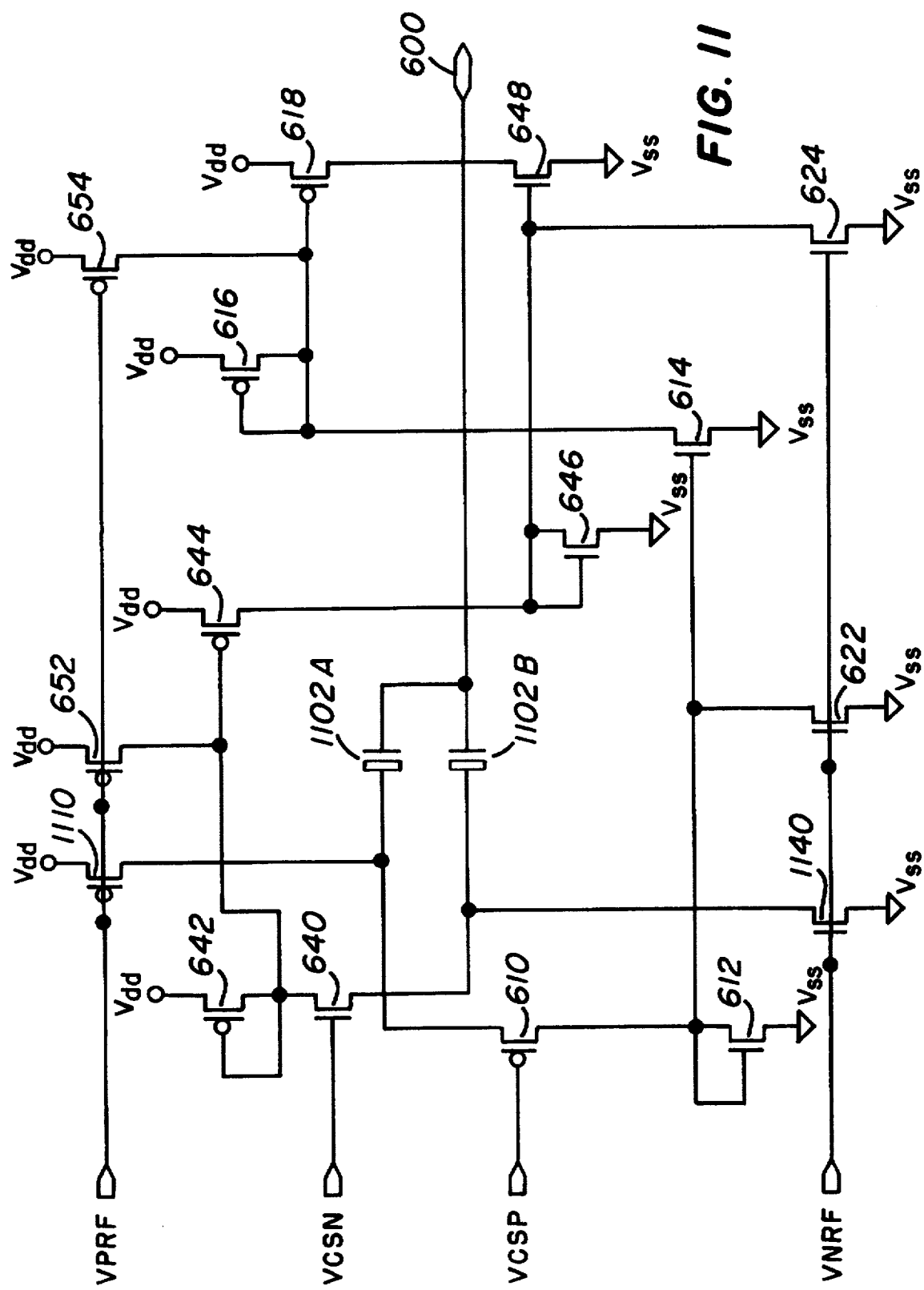
FIG. 11 shows modifications to the circuitry of FIG. 6 to bias cascode transistors 610 and 640 to increase operation speed.

FIG. 11 shows modifications to the circuitry of FIG. 6 to bias cascode transistors 610 and 640 to increase operation speed. Modifications are made in FIG. 11 to prevent cascode transistors 610 and 640 from turning off, as described above. Without such modifications, on a low to high transition, some time is required for cascode 610 to turn on and be biased to a desirable operating condition, similar to quiescent conditions for a BJT transistor. Similarly, when node 600 is high, cascode 640 turns off and will require some time to turn on during a high to low transition and reach a desirable operating state.

To prevent transistors 610 and 640 from turning off, biasing transistors 1110 and 1140 are added to the circuit of FIG. 6 as shown in FIG. 11. PMOS transistor 1110 has a source to drain path connecting Vdd to the source of cascode transistor 610. The gate of transistor 1110 is connected to the reference VPRF so that transistor 1110 provides current to the source of cascode 610 to prevent cascode 610 from turning off. NMOS transistor 1140 is also added having a source to drain path connecting Vss to the source of cascode transistor 640. The gate of transistor 1140 is connected to the reference VNRF so that transistor 1140 provides current to the source of cascode 640 to prevent cascode 640 from turning off.

In FIG. 11, the capacitor 602 of FIG. 6 is replaced by two capacitors 1102A and 1102B to prevent transistors 1110 and 1140 from cancelling each other's effect. Capacitor 1102A connects node 600 to the source of cascode 610, while capacitor 1102B connects node 600 to the source of cascode 640.

Figure 12:
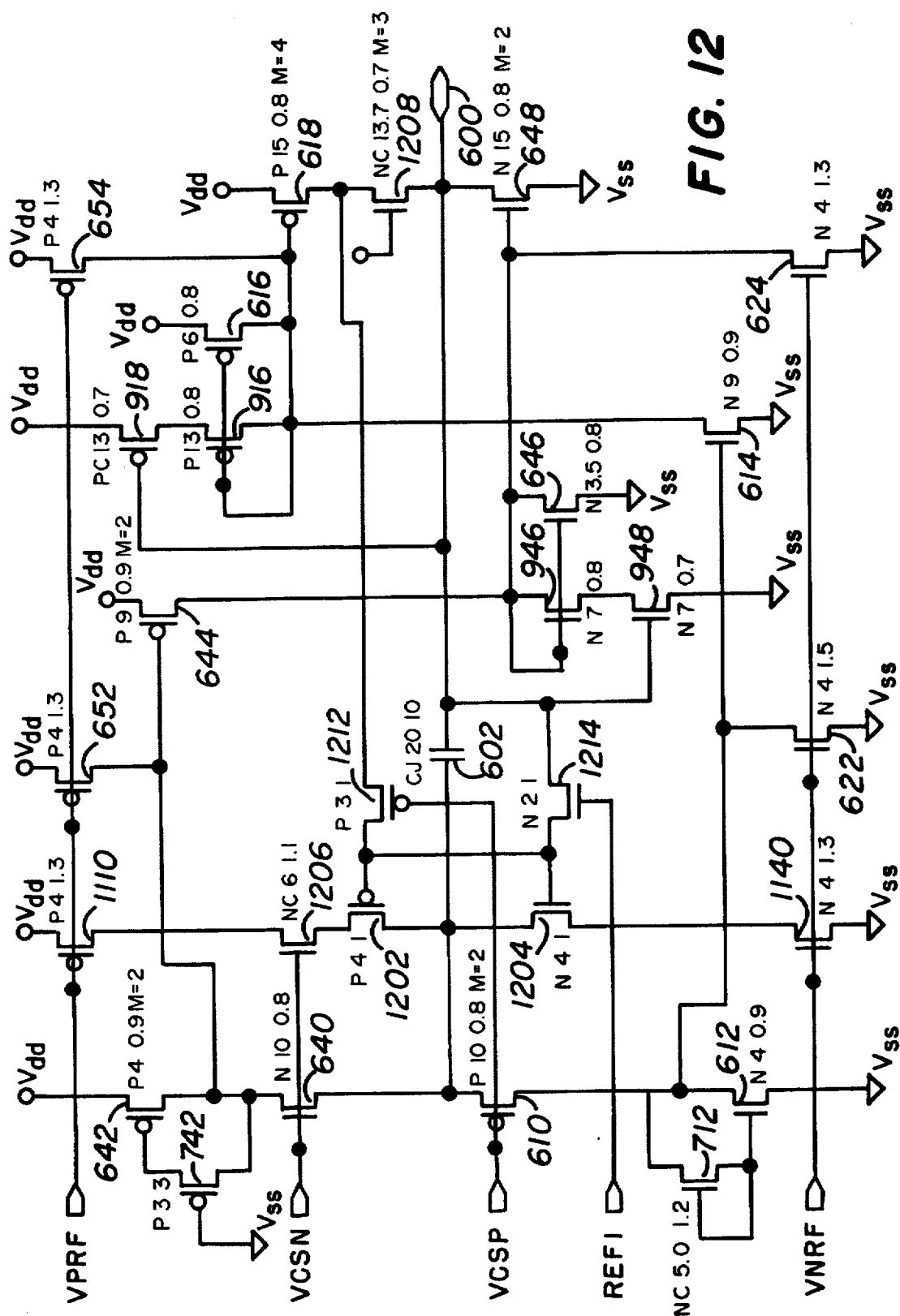
FIG. 12 shows a circuit combining the features of FIGS. 6, 7 and 9 and adding circuitry to provide biasing similar to FIG. 11, but utilizing only a single capacitor.

FIG. 12 shows a circuit combining the features of FIGS. 6, 7 and 9 and adding circuitry to provide biasing similar to FIG. 11, but utilizing only the single capacitor 602 connecting node 600 to the source of cascode transistors 610 and 640. For transistor symbols in the drawings, a suggested channel type and transistor dimensions are indicated next to the transistor with a p or n indicating channel type followed by channel width and length in microns. An additional M=2 is included to indicate that two such transistors are included and connected identically. M=4 indicates that four such transistors are identically connected. For suggested channel types followed by the letter C, the C indicates that additional ion implantation has been added in the channel to reduce the threshold of the transistor, effectively creating a depletion type device. Transistor sizes and types are only suggested and may be changed to meet particular design requirements.

FIG. 12 includes the components of FIG. 6 with delay transistors 712 and 742 coupling the gate to the drain of respective transistors 612 and 642, as in FIG. 7. Further, FIG. 12 includes noise reduction transistors 916 and 918 coupled with transistor 616 to control the gate of transistor 618, and noise reduction transistors 946 and 948 coupled with transistor 646 to control the gate of transistor 648 as in FIG. 9.

Similar to FIG. 11, the circuit of FIG. 12 includes biasing transistors 1110 and 1140, but unlike FIG. 11, FIG. 12 includes only the single capacitor 602 connecting node 600 to the source of transistors 610 and 640. To prevent transistors 1110 and 1140 from having a counteracting effect, the drain of transistor 1110 is coupled to the source of cascode transistor 610 through the source to drain path of PMOS transistor 1202, while the drain of transistor 1140 is coupled to the source of cascode transistor 640 through the source to drain path of NMOS transistor 1204. The gate of transistor 1202 is coupled to node 600 by the source to drain path of PMOS cascode transistor 1212. The gate of transistor 1204 is coupled to node 600 by the source to drain path of NMOS cascode transistor 1214. The gate of cascode transistor 1212 is connected to the reference voltage VCSP applied to cascode 610, while the gate of cascode is connected to reference voltage REF1. The gates of transistors 1202 and 1204 are connected together.

In operation with transistors 1202, 1204, 1212 and 1214 added as described above, we first assume that node 600 is high. With node 600 high, cascode transistor 610 will be on, but transistor 640 will require biasing current to prevent turnoff. Further with node 600 high, cascode 1214 will turn off, while cascode 1212 turns on, pulling the gates of transistors 1202 and 1204 high to turn on transistor 1204 and turn off transistor 1202. With transistor 1204 on, current will be provided from transistor 1140 to assure cascode 640 does not completely turn off. A current counteracting the current from transistor 1140 will not be provided by transistor 1110 because transistor 1202 will be off.

Next assuming node 600 is low, cascode transistor 640 will be on, but transistor 610 will require biasing current to prevent turnoff. Further with node 600 low, cascode 1212 will turn off, while cascode 1214 turns on, pulling the gates of transistors 1202 and 1204 low to turn on transistor 1202 and turn off transistor 1204. With transistor 1202 on, current will be provided from transistor 1110 to assure cascode 610 does not completely turn off. A current counteracting the current from transistor 1110 will not be provided by transistor 1140 because transistor 1204 will be off.

Appropriate reference voltages are applied to the gates of cascode transistors 1212 and 1214 to enable switching of these transistors during a high to low transition, or during a low to high transition so that transistors 1110 and 1140 are not turned on together. Transistor 1206 has a source to drain path connecting the drain of transistor 1110 to the source of cascode 1202, with an appropriate reference voltage, here VCSN, applied to its gate to assure the voltage at the source of transistor 1202 remains below Vdd, to a degree to enable voltage applied to the gate of transistor 1202 by transistor 1212 is adequate to turn transistor 1202 off.

An additional back biasing transistor 1208 is included in FIG. 12 with a source to drain path connecting the drain of transistors 1212 and 618 to node 600, and a gate connected to Vdd. Transistor 1208 prevents the voltage at the drain of transistors 1212 and 618 from exceeding Vdd which may cause circuit damage.

Figure 13:
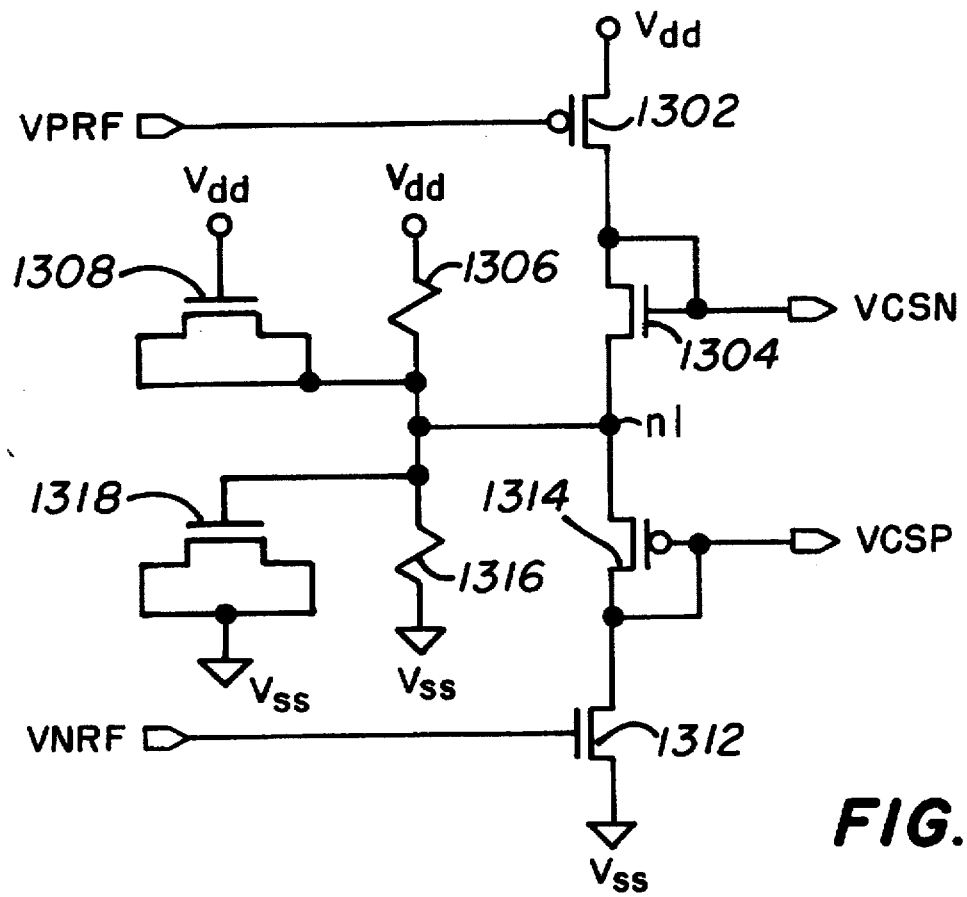
FIG. 13 shows circuitry for providing reference voltages utilized with the circuitry of FIGS. 6, 7, 9, 11 and 12.

FIG. 13 shows circuitry for providing the reference voltages VCSN and VCSP. In FIG. 13, PMOS transistor 1302 is connected as a current source having a source connected to Vdd and a gate connected to the reference voltage VPRF. NMOS transistor 1304 has a source to drain path connecting the drain of transistor 1302 to a node n1. The gate of transistor 1304 is connected to the drain of transistor 1302 to form the reference VCSN and to pass to node n1 only the current provided by transistor 1302. Likewise, transistor 1312 is connected as a current sink having a source connected to Vss and a gate connected to the reference voltage VNRF. PMOS transistor 1314 has a source to drain path connecting the drain of transistors 1312 to the node n1. The gate of transistor 1314 is connected to the drain of transistor 1312 to form the reference VCSP and to pass from node n1 only the current sank by transistor 1312.

Further in FIG. 13, a resistor divider is formed by resistor 1306 connected between Vdd and node n1 and resistor 1316 connected between Vss and node n1. The sizes of resistors 1306 and 1316 are set to control the voltage at node n1. With resistors 1306 and 1316 having substantially equal values, transistor 1302 will source the same current which transistor 1312 sinks. Capacitors 1308 and 1318 are utilized to reduce charge buildup if resistors 1306 and 1316 are large. Capacitor 1308 is connected from Vdd to node n1, while capacitor 1318 is connected from node n1 to Vss. With capacitive loading at reference points VCSN or VCSP, similar capacitors (not shown) can be added at points VCSN or VCSP to reduce charge buildup.

In operation, reference is made to FIG. 6 where VCSN is provided as a reference for cascode 640, while VCSP is provided as a reference for cascode 610. Assuming resistors 1306 and 1316 have equal values, with transistors 642, 640, 610 and 612 connected in a similar manner as respective transistors 1302, 1304, 1314 and 1312, transistor 642 will source the same voltage that transistor 612 sinks and the second terminal of capacitor 602 will maintain the same voltage as node n1 of FIG. 13. With any change in the voltage at the second terminal of capacitor 612 due to changes at node 600, transistor 640 will be biased to source current and transistor 610 will be biased to sink current needed to return the second terminal of capacitor to the voltage at node n1 in FIG. 11.

Figure 14:
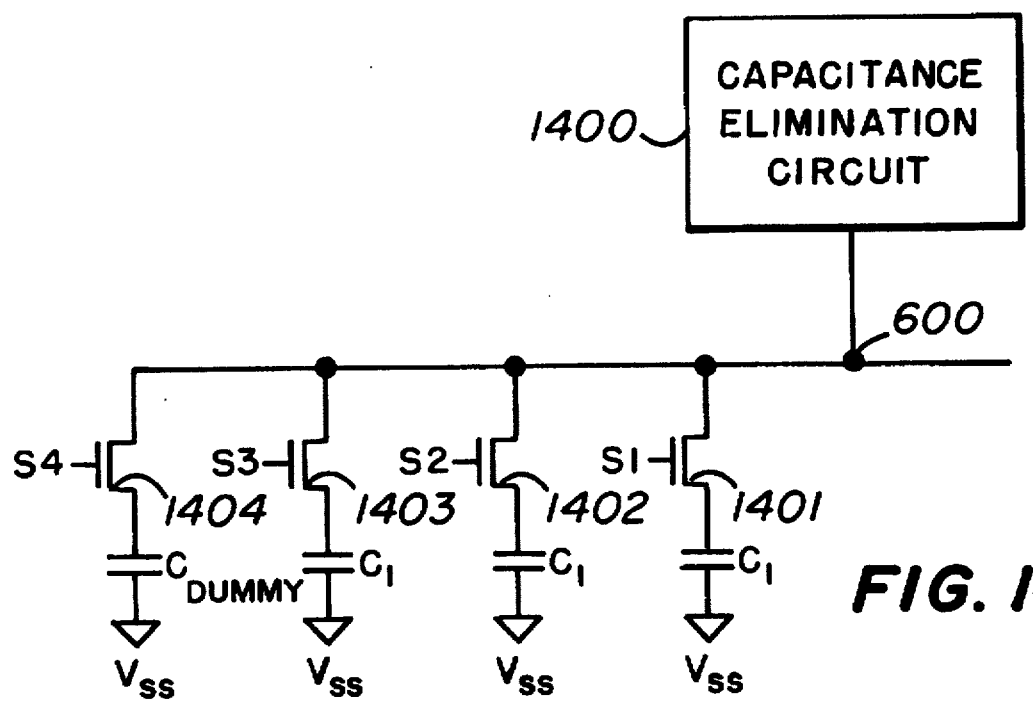
FIG. 14 illustrates a connection of the capacitance elimination circuit of the present invention to node of a device to assure capacitance at the node remains constant.

Because the present invention requires the capacitance at node 600 to be known, FIG. 14 illustrates a connection of the capacitance elimination circuit 1400 of the present invention to node 600 of a device to assure the capacitance at node 600 remains constant. Connected to node 600 are switching transistors 1401–1404. Switching transistors 1401–1403 function to selectively connect one of loads having a capacitance C1 to node 600. Should all of transistors 1401–1403 be turned off, transistor 1404 may then be configured to be turned on to connect a dummy capacitance having a value $C_{DUMMY}$ to maintain the capacitance at node 600 constant. The configuration of FIG. 14 is particularly representative of pass gates in a switch matrix of a PLD, wherein loads switched in by different pass gates will provide a constant capacitance, but when no pass gate is controlled to be connected to the node, a dummy capacitance may be connected. As an alternative configuration, if the capacitive loads switched in by transistors 1401–1404 are different, transistor 1404 may be configured to connect a variable capacitance to node 600 to assure that the capacitance at node 600 remains constant.

Although the invention has been described above with particularity, this was merely to teach one of ordinary skill in the art how to make and use the invention. Many modifications will fall within the scope of the invention, as that scope is defined by the claims which follow.

What is claimed is:

1. A capacitance elimination circuit comprising:
    a capacitor having a first terminal connected to the node in a circuit, the node having a parasitic capacitance, the capacitor further having a second terminal for providing an indication of a portion of current withdrawn from the node by the parasitic capacitance;
    a first current mirror including transistors having a first channel type comprising:
        a first transistor having a source to drain path coupling the second terminal of the capacitor to a first power supply, and a gate coupled to the source to drain path; and
        a second transistor having a gate connected to the gate of the first transistor, and a source to drain path coupled on one end to the first power supply; and
    a second current mirror including transistors having a second channel type comprising:
        a first transistor having a source to drain path coupled to the source to drain path of the second transistor of the first current mirror, and a gate coupled to its source to drain path; and
        a second transistor having a gate connected to the gate of the first transistor of the second current mirror, and a source to drain path coupling the first terminal of the capacitor to a second power supply.

2. The capacitance elimination circuit of claim 1 further comprising:
    a cascode transistor having the second channel type, the cascode transistor having a source to drain path coupling the second terminal of the capacitor to the source to drain path of the first transistor of the first current mirror, and a gate connected to a first voltage reference.

3. The capacitance elimination circuit of claim 2 further comprising:
    a first biasing transistor having the first channel type, the first biasing transistor having a source to drain path coupling the first power supply to the gates of the first and second transistors of the first current mirror, and a gate connected to a second voltage reference.

4. The capacitance elimination circuit of claim 2 further comprising
    a second biasing transistor having the second channel type, the second biasing transistor having a source to drain path coupling the second power supply to the gates of the first and second transistors of the second current mirror, and a gate connected to a third voltage reference.

5. The capacitance elimination circuit of claim 1, wherein the first channel type is an n-type, and the second channel type is a p-type, and wherein the capacitance elimination circuit further comprises:
    an NMOS delay transistor which is a depletion type device having a source to drain path coupling the gate of the first transistor of the first current mirror to its drain, and a gate connected to its source.

6. The capacitance elimination circuit of claim 1, wherein the first channel type is an n-type, and the second channel type is a p-type, and wherein the capacitance elimination circuit further comprises:
    a PMOS delay transistor having a source to drain path coupling the gate of the first transistor of the second current mirror to its drain, and a gate connected to the first power supply which is Vss.

7. The capacitance elimination circuit of claim 1, wherein the first channel type is a p-type, and the second channel type is an n-type, and wherein the capacitance elimination circuit further comprises:
    a PMOS delay transistor having a source to drain path coupling the gate of the first transistor of the first current mirror to its drain, and a gate connected to the second power supply which is Vss.

8. The capacitance elimination circuit of claim 1, wherein the first channel type is a p-type, and the second channel type is an n-type, and wherein the capacitance elimination circuit further comprises:
    an NMOS delay transistor which is a depletion type device having a source to drain path coupling the gate of the first transistor of the second current mirror to its drain, and a gate connected to its drain.

9. The capacitance elimination circuit of claim 1 wherein current gain provided by the first and second current mirrors is substantially equal to current loss due to the parasitic capacitance and the capacitor.

10. The capacitance elimination circuit of claim 1 wherein the capacitor has a capacitance value substantially less than the parasitic capacitance.

11. The capacitance elimination circuit of claim 1 further comprising:
    a parallel second current mirror transistor having a gate coupled to the gate of the first transistor of the second current mirror, and a source to drain path coupled on one end to the source to drain path of the first transistor of the second current mirror; and
    a noise reduction transistor having a gate coupled to the first terminal of the capacitor and a source to drain path coupling the second power supply to a second end of the source to drain path of the parallel second current mirror transistor.

12. The capacitance elimination circuit of claim 1 further comprising:
    a first switching transistor connecting a load causing the parasitic capacitance to the node; and
    a second switching transistor connecting a second capacitor having a value matching the parasitic capacitance to the node, the second switching transistor being controlled to turn on a current path from the node to the second capacitor when the first switching transistor is controlled to turn off a current path from the node to the load.

13. A capacitance elimination circuit comprising:
    a capacitor having a first terminal connected to a node having a parasitic capacitance and a second terminal;
    a PMOS cascode transistor having a source connected to the second terminal of the capacitor, a gate connected to a first voltage reference, and a drain;

a first current mirror comprising:
  a first NMOS transistor having a drain connected to the drain of the PMOS cascode transistor, a source connected to Vss, and a gate coupled to its drain; and
  a second NMOS transistor having a gate connected to the gate of the first NMOS transistor, a source connected to Vss, and a drain;
a second current mirror comprising:
  a first PMOS transistor having a drain connected to the drain of the second NMOS transistor of the first current mirror, a gate coupled to its drain, and a source connected to Vdd; and
  a second PMOS transistor having a gate connected the gate of the first PMOS transistor of the second current mirror, a drain connected to the first terminal of the capacitor, and a source connected to Vdd;
an NMOS cascode transistor having a source connected to the second terminal of the capacitor, a gate connected to a second voltage reference, and a drain;
a third current mirror comprising:
  a first PMOS transistor having a drain connected to the drain of the NMOS cascode transistor, a source connected to Vdd, and a gate coupled to its drain; and
  a second PMOS transistor having a gate connected to the gate of the first PMOS transistor of the third current mirror, a source connected to Vdd, and a drain; and
a fourth current mirror comprising:
  a first NMOS transistor having a drain connected to the drain of the second PMOS transistor of the third current mirror, a gate coupled to its drain, and a source connected to Vss; and
  a second NMOS transistor having a gate connected to the gate of the first NMOS transistor of the fourth current mirror, a drain connected to the first terminal of the capacitor, and a source connected to Vss.

14. The capacitance elimination circuit of claim 13 further comprising:
  a first NMOS biasing transistor having a source to drain path coupling Vss to the gates of the first and second NMOS transistors of the first current mirror, and a gate connected to a third voltage reference; and
  a first PMOS biasing transistor having a source to drain path coupling Vdd to the gates of the first and second PMOS transistors of the third current mirror, and a gate connected to a fourth voltage reference.

15. The capacitance elimination circuit of claim 13 further comprising:
  a second PMOS biasing transistor having a source to drain path coupling Vdd to the gates of the first and second PMOS transistors of the second current mirror, and a gate connected to a fourth voltage reference; and
  a second NMOS biasing transistor having a source to drain path coupling Vss to the gates of the first and second NMOS transistors of the fourth current mirror, and a gate connected to a third voltage reference.

16. The capacitance elimination circuit of claim 13 further comprising:
  a first NMOS delay transistor which is a depletion type device having a source to drain path coupling the gate of first NMOS transistor of the first current mirror to its drain, and a gate connected to its drain;
  a first PMOS delay transistor having a source to drain path coupling the gate of the first PMOS transistor of the third current mirror to its drain, and a gate connected to Vss.

17. The capacitance elimination circuit of claim 13 further comprising:
  a second NMOS delay transistor which is a depletion type device having a source to drain path coupling the gate of the first NMOS transistor of the fourth current mirror to its drain, and a gate connected to its drain; and
  a second PMOS delay transistor having a source to drain path coupling the gate of the first PMOS transistor of the second current mirror to its drain, and a gate connected to Vss.

18. The capacitance elimination circuit of claim 13, wherein the capacitor has a capacitance value substantially less than the parasitic capacitance.

19. The capacitance elimination circuit of claim 13,
  wherein current gain provided by the first and second current mirrors is substantially equal to current loss due to the parasitic capacitance and the capacitor, and
  wherein current gain provided by the third and fourth current mirrors is substantially equal to current loss due to the parasitic capacitance and the capacitor.

20. The capacitance elimination circuit of claim 13 further comprising:
  a parallel second current mirror PMOS transistor having a gate coupled to the gate of the first PMOS transistor of the second current mirror, and a source to drain path coupled on one end to the source to drain path of the first PMOS transistor of the second current mirror;
  a PMOS noise reduction transistor having a gate coupled to the first terminal of the capacitor, and a source to drain path coupling Vdd to the source to drain path of the parallel second current mirror PMOS transistor;
  a parallel fourth current mirror NMOS transistor having a gate coupled to the gate of the first NMOS transistor of the fourth current mirror, and a source to drain path coupled on one end to the source to drain path of the first NMOS transistor of the fourth current mirror; and
  an NMOS noise reduction transistor having a gate coupled to the first terminal of the capacitor, and a source to drain path coupling Vss to the source to drain path of the parallel second current mirror NMOS transistor.

21. The capacitance elimination circuit of claim 13 further comprising:
  an NMOS cascode biasing transistor having a source to drain path coupling Vss to the second terminal of the capacitor, and having a gate;
  a PMOS cascode biasing transistor having a source to drain path coupling Vdd to the second terminal of the capacitor, and having a gate connected to the gate of the NMOS cascode biasing transistor;
  an NMOS switching transistor having a source to drain path coupling the first terminal of the capacitor to the gate of the NMOS cascode biasing transistor, and a gate connected to a fifth voltage reference; and
  a PMOS switching transistor having a source to drain path coupling the first terminal of the capacitor to the gate of the PMOS cascode biasing transistor, and a gate connected to the first voltage reference.

22. The capacitance elimination circuit of claim 13 further comprising a reference signal generating circuit comprising:
  a first resistor connected from Vdd to a first node;
  a second resistor connected from the first node to Vss;

a first NMOS reference transistor having a gate connected to the third voltage reference, a drain connected to Vdd, and a source;

a first PMOS reference transistor having a drain connected to the first node, and a source connected to its gate and the source of the first NMOS reference transistor to provide the second voltage reference;

a second NMOS reference transistor having a gate connected to the third voltage reference, a source connected to Vss, and a drain; and a second PMOS reference transistor having a source connected to the first node, and its drain coupled to its gate and the drain of the second NMOS reference transistor to provide the second voltage reference.

23. The capacitance elimination circuit of claim 22 wherein the resistance value of the first transistor and the second transistor are substantially the same.

* * * * *